(12) United States Patent
Tsuchihashi

(10) Patent No.: US 9,306,556 B2
(45) Date of Patent: Apr. 5, 2016

(54) ANALOG-SWITCH CIRCUIT AND MOTOR DRIVE APPARATUS USING SAME

(75) Inventor: Masanori Tsuchihashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 174 days.

(21) Appl. No.: 14/125,979

(22) PCT Filed: Jun. 8, 2012

(86) PCT No.: PCT/JP2012/064754
§ 371 (c)(1),
(2), (4) Date: Dec. 13, 2013

(87) PCT Pub. No.: WO2012/173049
PCT Pub. Date: Dec. 20, 2012

(65) Prior Publication Data
US 2014/0117914 A1     May 1, 2014

(30) Foreign Application Priority Data
Jun. 16, 2011   (JP) .................. 2011-134368

(51) Int. Cl.
| | |
|---|---|
| H02P 1/24 | (2006.01) |
| H03K 17/687 | (2006.01) |
| H02P 6/08 | (2006.01) |
| H03K 17/693 | (2006.01) |
| H02P 23/00 | (2006.01) |
| H02P 6/18 | (2006.01) |

(52) U.S. Cl.
CPC .............. *H03K 17/687* (2013.01); *H02P 6/085* (2013.01); *H02P 6/182* (2013.01); *H02P 23/0095* (2013.01); *H03K 17/693* (2013.01); *H03K 2217/0054* (2013.01)

(58) Field of Classification Search
CPC .. H02P 21/0035; H02P 6/20; H02M 3/33507; G05B 19/0423
See application file for complete search history.

(56) References Cited

U.S. PATENT DOCUMENTS

| | | | |
|---|---|---|---|
| 6,377,008 | B1 | 4/2002 | Hirata |
| 2006/0082336 | A1 | 4/2006 | Kurosawa et al. |
| 2008/0297082 | A1 | 12/2008 | Kurosawa et al. |
| 2012/0221269 | A1* | 8/2012 | Wanner et al. .................. 702/65 |

FOREIGN PATENT DOCUMENTS

| | | |
|---|---|---|
| JP | 1-236731 | 9/1989 |
| JP | 2001-28891 | 1/2001 |
| JP | 2003-189680 | 7/2003 |
| JP | 2006-115599 | 4/2006 |

OTHER PUBLICATIONS

Japanese Patent Office, International Search Report for International Patent Application PCT/JP2012/064754 (Jul. 3, 2012).

* cited by examiner

*Primary Examiner* — Karen Masih
(74) *Attorney, Agent, or Firm* — Fish & Richardson P.C.

(57) ABSTRACT

An analog-switch circuit (1) having: a resistor (R1); a resistor (R2); a CMOS analog switch (S1) in which a first end is connected to an input end (Vin) via the resistor (R1), and a second end is connected to an output end (Vout); and a CMOS analog switch (S2), in which a first end is connected to the first end of the analog switch (S1), and a second end is connected to a ground end via the resistor (R2). The CMOS analog switch (S2) is turned on or off in antiphase to the analog switch (S1).

19 Claims, 11 Drawing Sheets

US 9,306,556 B2

ANALOG-SWITCH CIRCUIT AND MOTOR DRIVE APPARATUS USING SAME

TECHNICAL FIELD

The present invention relates to an analog switch circuit and a motor drive apparatus having the same.

BACKGROUND ART

FIG. 11A is a view showing a conventional example of an analog switch of CMOS [Complementary Metal Oxide Semiconductor] type, and FIG. 11B is a view showing an electrical drawing symbol of an analog switch ASW. The present conventional analog switch ASW has a MOS field effect transistor N of N channel type and a MOS field effect transistor P of P channel type that are connected in parallel with each other, and electrically connect/disconnect an application terminal for an input voltage Vin and an application terminal for an output voltage Vout in accordance with a control voltage Vctrl (+) and an inverting control voltage Vctrl (−) applied to their respective gates.

Sources of the transistors N and P correspond to a first terminal of the analog switch ASW, and are connected to the application terminal for the input voltage Vin. Drains of the transistors N and P correspond to a second terminal of the analog switch ASW, and are connected to the application terminal for the output voltage Vout. A gate of the transistor N corresponds to a control terminal of the analog switch ASW, and is connected to an application terminal for the control voltage Vctrl (+). A gate of the transistor P corresponds to an inverting control terminal of the analog switch ASW, and is connected to an application terminal for the inverting control voltage Vctrl (−). A back gate of the transistor N is connected to an application terminal for a ground voltage GND. A back gate of the transistor P is connected to an application terminal for a power supply voltage VDD.

In a case where the analog switch ASW is turned on, the control voltage Vctrl (+) is brought to a high level (power supply voltage VDD), while the inverting control voltage Vctrl (−) is brought to a low level (ground voltage GND). By the application of these voltages, at least one of the transistors P and N is turned on, and the application terminal for the input voltage Vin and the application terminal for the output voltage Vout are electrically connected to each other.

On the other hand, in a case where the analog switch ASW is turned off, the control voltage Vctrl (+) is brought to a low level (ground voltage GND), while the inverting control voltage Vctrl (−) is brought to a high level (power supply voltage VDD). By the application of these voltages, both transistors P and N are turned off, and the application terminal for the input voltage Vin and the application terminal for the output voltage Vout are electrically disconnected from each other.

CITATION LIST

Patent Literature

PLT1: JP-A-2003-189680

SUMMARY OF INVENTION

Technical Problem

If the input voltage Vin is in a usual range (from the power supply voltage VDD to the ground voltage GND), even the above conventional analog switch ASW does not suffer noticeable trouble. However, in a case where the input voltage Vin (≥VDD+Vth) higher than the power supply voltage VDD by at least an on-threshold voltage Vth of the transistor P is applied for some reason, even if the control voltage Vctrl (+) is brought to the low level (ground voltage GND) and the inverting control voltage Vctrl (−) is brought to the high level (power supply voltage VDD) to turn off the analog switch ASW, there is a risk that the transistor P is turned on against expectations and the application terminal for the input voltage Vin and the application terminal for the output voltage Vout are erroneously connected electrically to each other. Besides, also in a case where the input voltage Vin (≤GND−Vth) lower than the ground voltage GND by at least an on-threshold voltage Vth of the transistor N is applied for some reason, there is a risk that the transistor N would be turned off against expectations and the same erroneous operation as the above erroneous operation occurs.

As an example of a conventional technology contributory to solution of the above problem, a patent document 1 discloses a structure that is provided with a clamp circuit to prevent an applied voltage to a terminal from becoming larger than a predetermined value. However, in a case where there are many clamp target terminals, many clamp circuits are necessary, so that a large circuit scale and a cost increase are incurred, which is not an optimum solution.

In light of the above problem found by the inventor of the present application, it is an object of the present invention to provide an analog switch circuit capable of preventing an unexpected erroneous turning-on and a motor drive apparatus that uses the analog switch circuit.

Solution to Problem

To achieve the object, an analog switch circuit according to the present invention has a structure (first structure) that includes: a first resistor; a second resistor; a first analog switch of CMOS type whose first terminal is connected to an input terminal via the first resistor and second terminal is connected to an output terminal; and a second analog switch of CMOS type whose first terminal is connected to the first terminal of the first analog switch and second terminal is connected to a ground terminal via the second resistor, and is turned on/off in a phase reverse to the first analog switch.

In the meantime, the analog switch circuit having the first structure may have a structure (second structure) that further includes a third resistor that is inserted between the third analog switch and the input terminal.

Besides, the analog switch circuit having the second structure may have a structure (third structure) which further includes a third analog switch that is inserted between the first resistor and the input terminal, and is turned on/off in a phase identical to the first analog switch.

Besides, the analog switch circuit having any one of the first to third structures may have a structure (fourth structure) in which a resistance value of the first resistor is set at a value larger than a resistance value of the second resistor.

Besides, a motor drive apparatus according to the present invention has a structure (fifth structure) that includes: a selector that selects and outputs successively each of phase drive voltages for a three-phase motor; a comparator that compares a common voltage of the three-phase motor with the selected phase drive voltage to generate a comparison signal; a controller that generates a phase drive control signal for the three-phase motor in accordance with the comparison signal; and a driver that generates the phase drive voltage for the three-phase motor in accordance with the phase drive control signal; wherein the selector includes the analog switch circuit for each of phases as a device for electrically connecting/disconnecting an application terminal for the phase drive voltage and the comparator.

Besides, the motor drive apparatus having the fifth structure may have a structure (sixth structure) in which the analog switch circuits for the respective phases share the second resistor with each other.

Besides, the motor drive apparatus having the fifth structure or the sixth structure may have a structure (seventh structure) in which the selector is inserted between an application terminal for the common voltage and the comparator and further includes a dummy analog switch circuit that is normally kept in an on-state.

Besides, the motor drive apparatus having any one of the fifth to seventh structures may have a structure (eighth structure) which includes a filter that is inserted between the selector and the comparator.

Besides, the motor drive apparatus having the eighth structure may have a structure (ninth structure) in which the filter is an RC filter that uses a resistor and a capacitor.

Besides, an electric vehicle according to the present invention has a structure (tenth structure) that includes the motor drive apparatus that includes any one of the fifth to ninth structures.

Besides, a home appliance according to the present invention has a structure (eleventh structure) that comprises the motor drive apparatus that includes any one of the fifth to ninth structures.

Besides, an industrial apparatus according to the present invention has a structure (twelfth structure) that comprises the motor drive apparatus that includes any one of the fifth to ninth structures.

Advantageous Effects of Invention

According to the present invention, it becomes possible to provide an analog switch circuit capable of preventing an unexpected erroneous turning-on and a motor drive apparatus that uses the analog switch circuit.

DESCRIPTION OF EMBODIMENTS

<Analog Switch Circuit>

Figure 1:
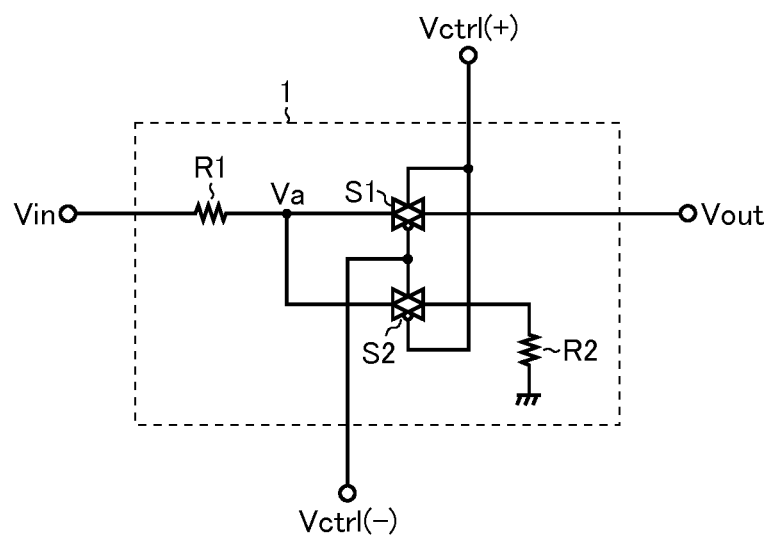
FIG. 1 is a view showing a first embodiment of an analog switch circuit.

FIG. 1 is a view showing a first embodiment of an analog switch circuit. An analog switch circuit 1 according to the first embodiment has: resistors R1 and R2; analog switches S1 and S2 of CMOS type.

A first terminal of the analog switch S1 is connected to an application terminal for an input voltage Vin via the resistor R1. A second terminal of the analog switch S1 is connected to an application terminal for an output voltage Vout. A control terminal of the analog switch S1 is connected to an application terminal for a control voltage Vctrl (+). An inverting control terminal of the analog switch S1 is connected to an application terminal for an inverting control voltage Vctrl (−).

A first terminal of the analog switch S2 is connected to the first terminal of the analog switch S1. A second terminal of the analog switch S2 is connected to an application terminal for a ground voltage GND via the resistor R2. A control terminal of the analog switch S2 is connected to the application terminal for the inverting control voltage Vctrl (−). An inverting control terminal of the analog switch S2 is connected to the application terminal for the control voltage Vctrl (+).

Figure 11A:
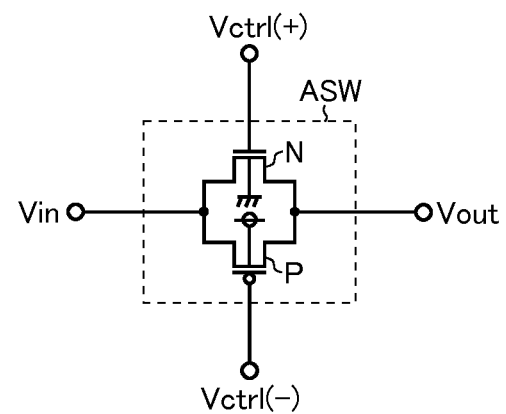
FIG. 11A is a view showing a conventional example of an analog switch of CMOS type.
Figure 11B:
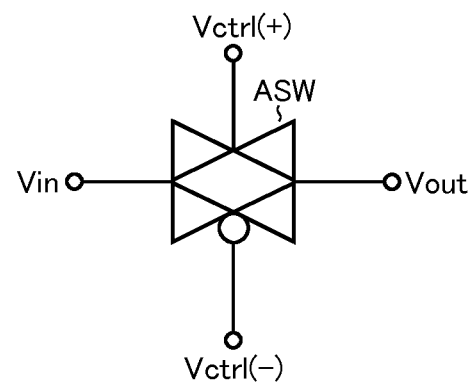
FIG. 11B is a view showing an electrical drawing symbol of an analog switch of CMOS type.

Like an analog switch ASW in FIG. 11A, the analog switches S1 and S2 each have a MOS field effect transistor N of N channel type and a MOS field effect transistor P of P channel type that are connected in parallel with each other, and turned on/off in phases reverse to each other in accordance with the control voltage Vctrl (+) and the inverting control voltage Vctrl (−) that are applied to the respective gates.

In a case of turning on the analog switch circuit 1, the control voltage Vctrl (+) is brought to a high level (power supply voltage DVV), while the inverting control voltage Vctrl (−) is brought to a low level (ground voltage GND). By the application of these voltages, the analog switch S1 is turned on, whereby the application terminal for the input voltage Vin and the application terminal for the output voltage Vout are electrically connected to each other. At this time, the analog switch S2 is turned off; accordingly, a node voltage Va applied to the first terminal of the analog switch S1 is not unnecessarily pulled down and a usual signal path is not adversely affected.

On the other hand, in a case of turning off the analog switch circuit 1, the control voltage Vctrl (+) is brought to a low level (ground voltage GND), while the inverting control voltage Vctrl (−) is brought to a high level (power supply voltage VDD). By the application of these voltages, the analog switch S1 is turned off, whereby the application terminal for the input voltage Vin and the application terminal for the output voltage Vout are electrically disconnected from each other. At this time, the analog switch S2 is turned on; accordingly, the node voltage Va is pulled down to a voltage value (=Vin×R2/(R1+R2)) obtained by dividing the input voltage Vin by means of the resistors R1 and R2.

In the meantime, to sufficiently pull down the node voltage Va, it is desirable to set a resistance value of the resistor R1 at a value (e.g., R1=19.1 kΩ, R2=3 kΩ) larger than a resistance value of the resistor R2.

By employing such a structure, not only in a case where the input voltage Vin is in a usual range (from the power supply voltage VDD to the ground voltage GND) but also in a case where the input voltage Vin (≥VDD+Vth) higher than the power supply voltage VDD by at least an on-threshold voltage Vth of the transistor P is applied for some reason, it is possible to prevent the node voltage Va from becoming equal to or higher than (VDD+Vth); accordingly, it becomes possible to prevent an unexpected erroneous turning-on of the transistor P that is included in the analog switch S1. Besides, even in a case where the input voltage Vin (≤GND−Vth) lower than the ground voltage GND by at least an on-threshold voltage Vth of the transistor N (see FIG. 11A) is applied for some reason, it is possible to prevent the node voltage Va from becoming equal to or lower than (GND−Vth); accordingly, it becomes possible to prevent an unexpected erroneous turning-on of the transistor N that is included in the analog switch S1.

Therefore, when turning off the analog switch circuit 1 according to the first embodiment, even in a case where any input voltage Vin is applied, it is possible to surely turn off the analog switch S1; accordingly, it becomes possible to surely disconnect electrically the application terminal for the input voltage Vin and the application terminal for the output voltage Vout from each other.

Figure 2:
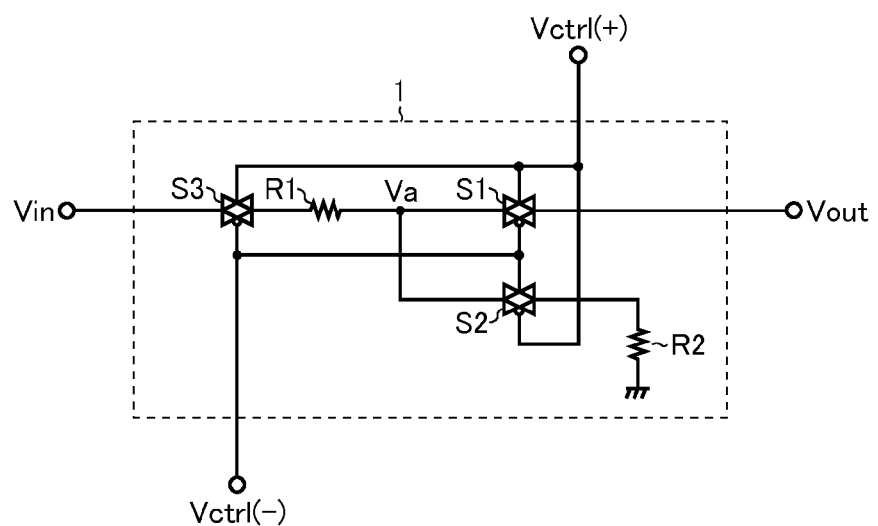
FIG. 2 is a view showing a second embodiment of an analog switch circuit.

FIG. 2 is a view showing a second embodiment of the analog switch circuit. The analog switch circuit 1 according to the second embodiment has substantially the same structure as the above first embodiment, and has a feature of further including an analog switch S3. Because of this, the same components as the first embodiment are indicated by the same reference numbers as those in FIG. 1 to skip double description, and hereinafter, description is performed focusing on the feature point of the second embodiment.

The analog switch S3 is inserted between the resistor R1 and the application terminal for the input voltage Vin and turned on/off in a phase identical to the analog switch S1. According to such a structure, in a case where the input voltage Vin is in the usual range during an off-period of the analog switch circuit 1, the analog switch S3 is turned off; accordingly, it becomes possible to electrically separate the resistors R1 and R2 from the application terminal for the input voltage Vin to curb an influence on the pre-stage circuit that is connected to the application terminal for the input voltage Vin. On the other hand, in a case where the input voltage Vin equal to or higher than (VDD+Vth) or equal to or lower than (GND−Vth) is applied during the off-period of the analog switch circuit 1, the analog switch S3 is unexpectedly turned on; however, as described above, by using the resistors R1 and R2, it is possible to adjust the node voltage Va to be equal to or lower than (VDD+Vth) or to be equal to or higher than (GND−Vth); accordingly, it becomes possible to surely electrically disconnect the application terminal for the input voltage Vin and the application terminal for the output voltage Vout from each other by surely turning off the analog switch S1.

Figure 3:
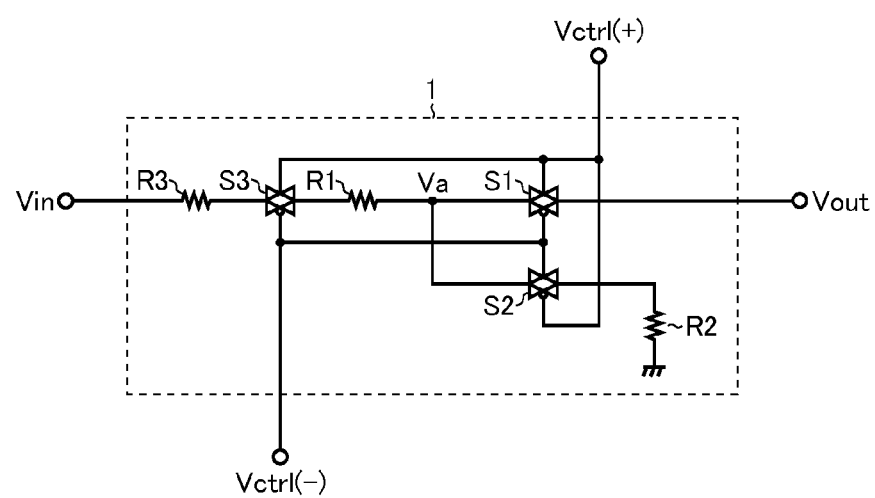
FIG. 3 is a view showing a third embodiment of an analog switch circuit.

FIG. 3 is a view showing a third embodiment of the analog switch circuit. The analog switch circuit 1 according to the third embodiment has substantially the same structure as the above second embodiment, and has a feature of further including a resistor R3. Because of this, the same components as the second embodiment are indicated by the same reference numbers as those in FIG. 2 to skip double description, and hereinafter, description is performed focusing on the feature point of the third embodiment.

The resistor R3 is inserted between the analog switch S and the application terminal for the input voltage Vin. According to such a structure, by arbitrarily setting a resistance value of the resistor R3 (e.g., 1 kΩ), during an on-period of the analog switch circuit 1, it becomes possible to arbitrarily adjust an amount of an electric current that flows from the application terminal for the input voltage Vin to the application terminal for the output voltage Vout and to protect an internal device.

<Motor Drive Apparatus>

Figure 4:
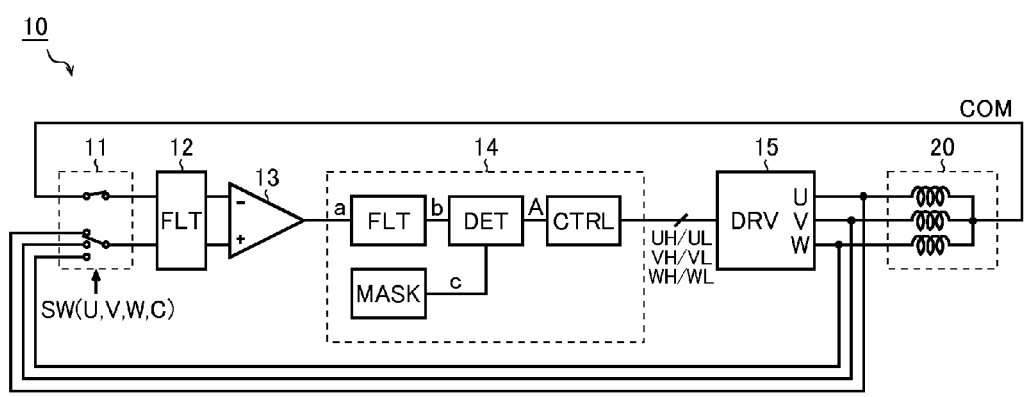
FIG. 4 is a view showing a structural example of a motor drive apparatus.

FIG. 4 is a view showing a structural example of a motor drive apparatus. A motor drive apparatus 10 in the present structural example is a main body for performing drive control of a three-phase motor (three-phase brushless motor) 20 and has a selector 11, a filter 12, a comparator 13, a controller 14, and a driver 15.

The selector 11 successively selects and outputs phase drive voltages U/V/W for the three-phase motor 20 in accordance with switchover signals SW (U/V/W). More specifically, the selector 11 selects and outputs the drive voltage U during an M period (shift period from an L period to an H period or from the H period to the L period) of the drive voltage U, selects and outputs the drive voltage V during the M period of the drive voltage V, and selects and outputs the drive voltage W during the M period of the drive voltage W. In other words, the selector 11 selects and outputs counter electromotive voltages that occur in the respective phase coils of the three-phase motor 20. Besides, the selector 11 normally selects and outputs a common voltage COM of the three-phase motor 20 in accordance with the switchover signal SW (C).

The filter 12 is inserted between the selector 11 and the comparator 13, and removes a noise component from the common voltage COM of the three-phase motor 20 selected by the selector 11 and from the phase drive voltages U/V/W. As the filter 12, it is possible to use, for example, an RC filter that uses a resistor and a capacitor (see FIG. 8). In the meantime, a cut-off frequency of the filter 12 may be set at any value, for example, 15 kHz.

The comparator 13 compares the common voltage COM of the three-phase motor 20 applied to an inverting input terminal (−) with the phase drive voltage U/V/W successively applied to the non-inverting input terminal (+) to generate a comparison signal a. The comparison signal a goes to a low level if the common voltage COM is higher than the phase drive voltage U/V/W, and goes to a high level if the common voltage COM is lower the phase drive voltage U/V/W.

Based on the comparison signal a, the controller 14 generates internally a speed signal A that has a frequency corresponding to a rotation speed the three-phase motor 20, and generates phase drive control signals (UH/UL, VH/VL, WH/WL) to perform feedback control of the rotation speed of the three-phase motor based on the speed signal A. More specifically, when the frequency of the speed signal A is higher than a predetermined target frequency, the controller 14 generates the phase drive control signals (UH/UL, VH/VL, WH/WL) to drop the rotation speed of the three-phase motor 20; reversely, when the frequency of the speed signal A is lower than the predetermined target frequency, the controller 14 generates the phase drive control signals (UH/UL, VH/VL, WH/WL) to raise the rotation speed of the three-phase motor 20. In the meantime, when performing the speed control of the three-phase motor 20, the controller 14 performs PWM [pulse width modulation] control of the phase drive control signals (UH/UL, VH/VL, WH/WL).

The driver 15 includes half-bridge-connected power transistors (not shown) for the respective phases of the three-phase motor 20, and generates the phase drive voltages U/V/W based on the phase drive control signals (UH/UL, VH/VL, WH/WL) input into the respective gates.

Figure 5:
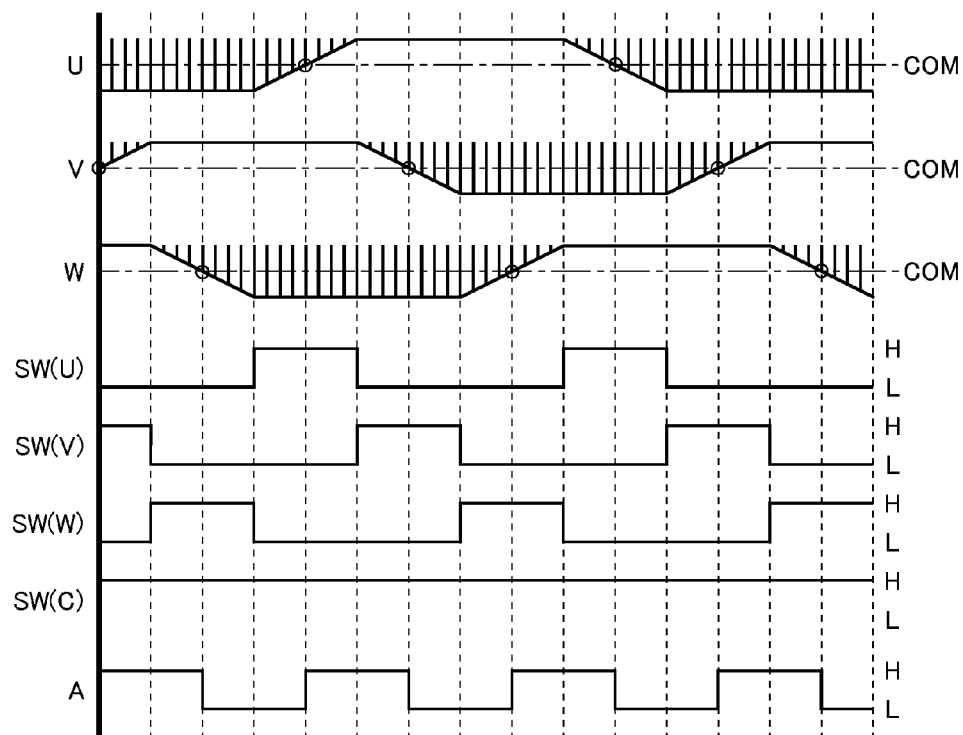
FIG. 5 is a time chart showing an operational example of a motor drive apparatus 10.

FIG. 5 is a time chart showing an operational example of the motor drive apparatus 10, and in order from top, illustrates the drive voltage U, the drive voltage V, the drive voltage W, the switchover signal SW (U), the switchover signal SW (V), the switchover signal SW (W), the switchover signal SW (C), and the speed signal A. In the meantime, vertical hatchings on the phase drive voltages U/V/W indicate that the phase drive voltages U/V/W are under the PWM control.

The switchover signal SW (U) is kept at the high level (power supply voltage VDD) during the M period of the drive voltage U and kept at the low level (ground voltage GND) during the other periods. The switchover signal SW (V) is kept at the high level (power supply voltage VDD) during the M period of the drive voltage (V) and kept at the low level (ground voltage GND) during the other periods. The switchover signal SW (W) is kept at the high level (power supply voltage VDD) during the M period of the drive voltage (W) and kept at the low level (ground voltage GND) during the other periods. The switchover signal SW (C) is normally kept at the high level (VDD).

The selector 11 selects and outputs the drive voltage U during the H period of the switchover signal SW (U), selects and outputs the drive voltage V during the H period of the switchover signal SW (V), selects and outputs the drive voltage W during the H period of the switchover signal SW (W). Besides, the selector 11 normally selects and outputs the common voltage COM in accordance with the switchover signal SW (C) that is normally kept at the high level.

The common voltage COM output from the selector 11 and the phase drive voltages U/V/W are input into the comparator 13 via the filter 12. The comparator 13 compares the common voltage COM with the phase drive voltages U/V/W to generate the comparison signal a. Based on the comparison signal a, the controller 14 generates internally the speed signal A that has the frequency corresponding to the rotation speed of the three-phase motor 20.

In the meantime, an ideal waveform of the speed signal A is a rectangular waveform that rises from the low level to the high level when the phase drive voltages U/V/W become higher than the common voltage COM on the way to shift from the L period to the H period, reversely, falls from the high level to the low level when the phase drive voltages U/V/W become lower than the common voltage COM on the way to shift from the H period to the L period.

However, depending on the circuit structure of the selector 11, there is a case where the rising time and falling time of the speed signal A deviate from the original timing to impair output feedback control (and drive control of the three-phase motor 20) performed by the controller 14. Hereinafter, such a problem is described specifically.

Figure 6:
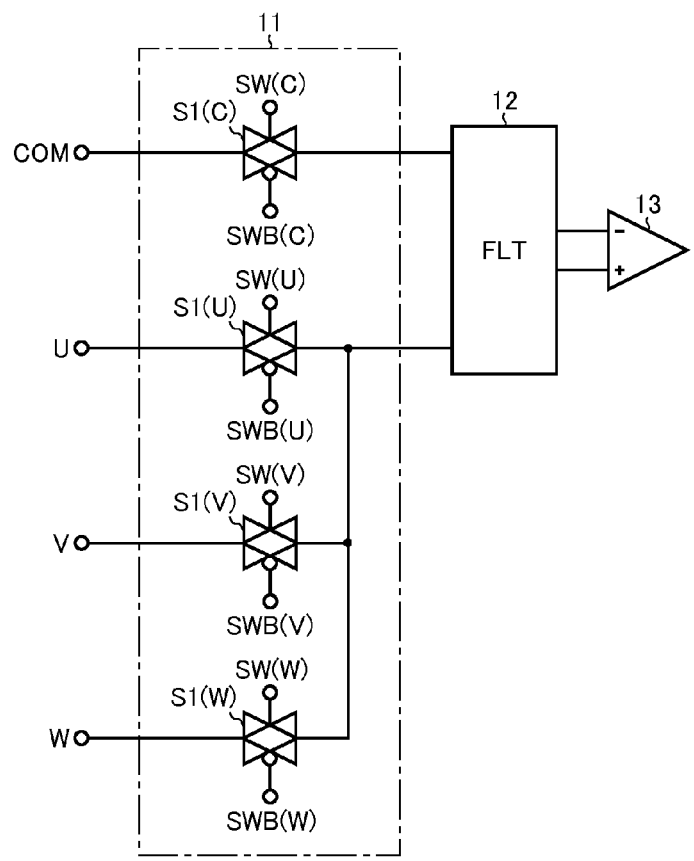
FIG. 6 is a view showing a first structural example of a selector 11.

FIG. 6 is a view showing a first structural example (structure likely to cause the above problem) of the selector 11. The selector 11 in the first structural example includes analog switches S1 (C), S1 (U), S1 (V), and S1 (W). The analog switch S1 (C) is connected between an application terminal for the common voltage COM and a first input terminal (and the inverting input terminal (−) of the comparator 13) of the filter 12. The analog switches S1 (U), S1 (V), and S1 (W) are respectively connected between the application terminals for the respective phase drive voltages (U, V, W) and a second input terminal (and the non-inverting input terminal (+) of the comparator 13) of the filter 12.

Like the analog switch ASW in FIG. 11A, the analog switches S1 (C), S1 (U), S1 (V), and S1 (W) each have a MOS field effect transistor N of N channel type and a MOS field effect transistor P of P channel type that are connected in parallel with each other and are turned on/off in accordance with the switchover signals SW (C), SW (U), SW (V), and SW (W) (which each correspond to the above control voltage Vctrl (+)) and the inverting switchover signals SWB (C), SWB (U), SWB (V), and SWB (W) (which each correspond to the above inverting control voltage Vctrl (−)) that are applied to the respective gates. In the meantime, in the selector 11, the analog switch S1 (C) is normally kept in the on-state, while only one of the analog switches S1 (U), S1 (V), and S1 (W) is successively turned on.

Figure 7A:
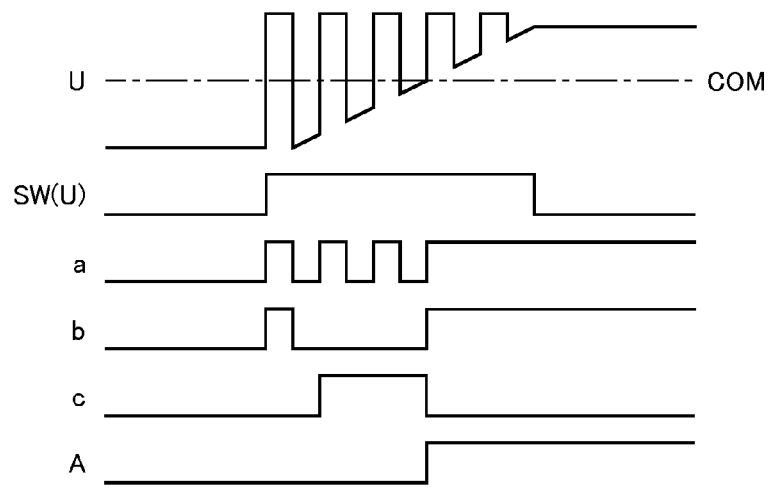
FIG. 7A is a time chart showing a first example (normal time) of an output feedback operation.
Figure 7B:
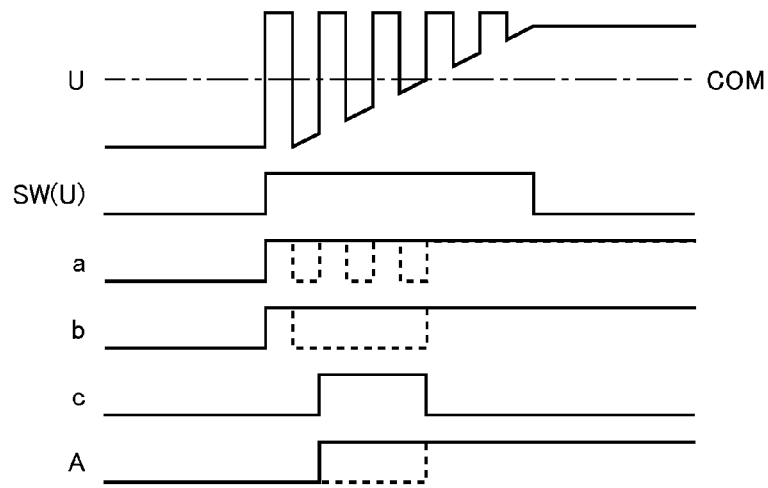
FIG. 7B is a time chart showing a second example (unusual time) of an output feedback operation.

FIG. 7A and FIG. 7B are time charts each of which shows a first example (normal time) and second example (unusual time) of an output feedback operation, and in order from top, illustrates the drive voltage U, the switchover signal SW (U), the comparison signal a, the filtered comparison signal b, a mask signal c, and the speed signal A. In the meantime, hereinafter, for the sake of description, a case where the drive voltage U is selected and output by the selector 11 is described as an example; however, the description applies also to cases where the drive voltage V and the drive voltage W are selected.

First, with reference to FIG. 6 and FIG. 7A, the first example (normal period) of the output feedback operation is described. During the M period of the drive voltage U, the switchover signal SW (U) is brought to the high level to turn on the analog switch S1 (U), while the switchover signals SW (V) and SW (W) are brought to the low level to turn off the analog switches S1 (V) and S1 (W) are turned off. Accordingly, the drive voltage U is selected and output from the selector 11, and the comparator 13 compares the drive voltage U and the common voltage COM with each other to generate the comparison signal a.

In the controller 14 into which the comparison signal a from the comparator 13 is input, first, a predetermined filtering process is applied to the comparison signal a. The filtered comparison signal b has a waveform in which unnecessary pulses caused by a PWM component of the drive voltage U are partially removed compared with the original comparison signal a. Next, in the controller 14, detection (logic level determination) of the comparison signal b is performed for a predetermined signal detection period (high level period of the mask signal c), and a logic level of the speed signal A is switched in accordance with the detection result. An ideal waveform of the speed signal A generated by such internal signal process of the controller 14 is a rectangular waveform that rises from the low level to the high level when the drive voltage U becomes higher than the common voltage COM on the way to shift from the L period to the H period.

Next, with reference to FIG. 6 and FIG. 7B, the second example (unusual period) of the output feedback operation is described. As described above, During the M period of the drive voltage U, the switchover signal SW (U) is brought to the high level to turn on the analog switch S1 (U), and the drive voltage U is selected and output from the selector 11. At this time, both switchover signals SW (V) and SW (W) are kept in the low level; accordingly, both analog switches S1 (V) and S1 (W) have to be kept in the off-state in essence, and in the comparator 13, the drive voltage U only and the common voltage COM have to be compared with each other to generate the comparison signal a.

However, in a case where the drive voltage V or W (≥VDD+Vth) higher than the power supply voltage VDD by the on-threshold voltage Vth of the transistor P is applied for some reason, even if the switchover signals SW (V) and SW (W) are kept at the low level (ground voltage GND) to turn off the analog switches SW (V) and SW (W), there is a risk that the transistor P is tuned on against expectations to add and output the unnecessary drive voltage V or W although only the drive voltage U should be selected and output in essence. For example, depending on a motor drive condition (motor characteristic and drive current value), the drive voltage of a phase (phase that is not a monitor target) under PWM driving is likely to dramatically fluctuate to a voltage value higher than the power supply voltage VDD, and there is a risk that the voltage value exceeds (VDD+Vth) to cause the above unusual state. Besides, also in a case where the drive voltage V or W (≤GND−Vth) lower than the ground voltage GND by the on-threshold voltage Vth of the transistor N is applied, there is a risk that the same unusual state as the above description is caused.

When trapped into such unusual state, an average value of the drive voltage (U+V) or (U+W) becomes higher than the common voltage COM; accordingly, the comparison signal a generated by the comparator 13 and the filtered comparison signal b generated in the controller 14 are brought to a state to be kept at substantially the high level. As a result of this, at the same time the predetermined signal detection period starts, the logic level of the speed signal A is switched; accordingly, there is a risk that the rising timing of the speed signal A deviates from the original timing to impair the output feedback control (and the drive control of the three-phase motor 20) performed by the controller 14.

Figure 8:
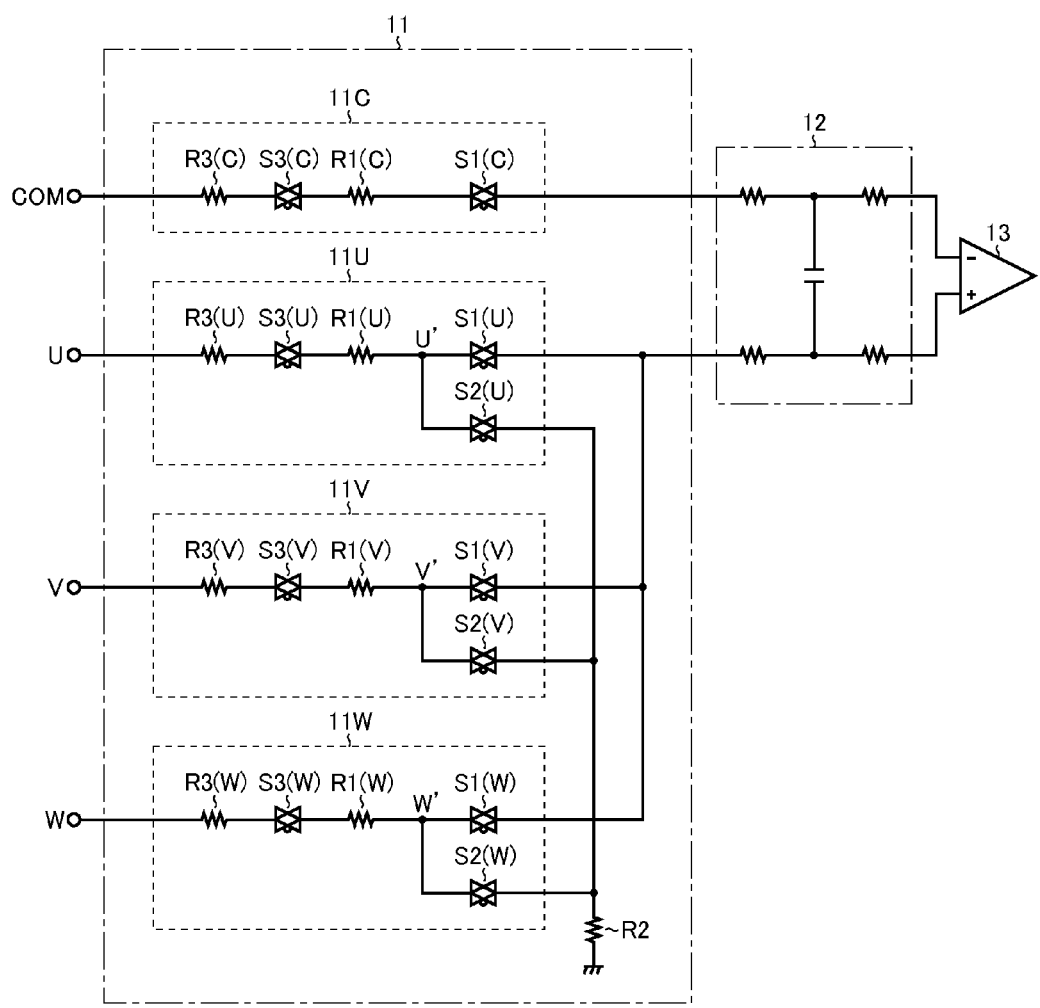
FIG. 8 is a view showing a second structural example of the selector 11.

FIG. 8 is a view showing a second structural example (structure capable of solving the above problem) of the selector 11. The selector 11 in the second structural example includes analog switch circuits 11C, 11U, 11V, and 11W. The analog switch circuit 11C is connected between the application terminal for the common voltage COM and the first input terminal of the filter 12 (and the inverting input terminal (−) of the comparator 13). The analog switch circuits 11U, 11V, and 11W are respectively connected between the application terminals for the respective drive voltages (U, V, W) and the second input terminal of the filter 12 (and the non-inverting input terminal (+) of the comparator 13).

The analog switch circuits 11U, 11V, and 11W each have basically the same structure as the analog switch circuit 1 in FIG. 3. However, the analog switch circuits 11U, 11V, and 11W do not have a structure in which each phase has the resistor R2 but have a structure in which all the phases share the single resistor R2 with each other. According to such a structure, it becomes possible to reduce a circuit scale of the selector 11. Of course, the structure in which each phase has the resistor R2 may be employed.

Besides, except for that the analog switch S2 and the resistor R2 are removed in light of that the analog switch circuit 11C is normally kept in an on-state, the analog switch circuit 11C includes quite the same structure as the analog switch circuits 11U, 11V, and 11W. As described above, by employing the structure in which the dummy analog switch circuit 11C normally kept in the on-state is inserted between the application terminal for the common voltage COM and the first input terminal of the filter 12 (and the inverting input terminal (−) of the comparator 13), it is possible to match a signal loss component of the common voltage COM with a signal loss component of each of the phase drive voltages U/V/W in the selector 11; accordingly, it becomes possible to raise accuracy of the output feedback control performed by the controller 14.

In the meantime, in FIG. 8, for the sake of illustration, the control voltages Vctrl (+) and Vctrl (−) illustrated in FIG. 3 are omitted; however, like in FIG. 3, the switchover signal SW corresponding to the control voltage Vctrl (+) and the inverting switchover signal SWB corresponding to the inverting control voltage Vctrl (−) are applied to all the analog switch circuits 11C, 11U, 11V, and 11W. In other words, the analog switches 51 and S2 are turned on/off in phases opposite to each other, while the analog switches 51 and S3 are turned on/off in phases identical to each other.

In the selector 11 in the second structural example, for example, in a case where the drive voltage U is selected and output, the analog switch circuit 11U is turned on, while the analog switch circuits 11V and 11W are turned off. In the turned-on analog switch circuit 11U, the analog switches S1 (U) and S3 (U) are turned on, whereby the application terminal for the drive voltage U and the second input terminal of the filter 12 (and the non-inverting input terminal (+) of the comparator 13) are electrically connected to each other. At this time, the analog switch S2 (U) is turned off; accordingly, a node voltage U' applied to the first terminal of the analog switch S1 (U) is not unnecessarily pulled down, and the usual signal path is not adversely affected.

On the other hand, in the turned-off analog switch circuit 11V, the analog switches S1 (V) and S3 (V) are turned off, while the analog switch S2 (V) is turned on. Here, in a case where an output voltage V equal to or higher than (VDD+Vth) or equal to or lower than (GND−Vth) is applied, the analog switch S3 (V) is unexpectedly turned on; however, as described above, by using the resistors R1 and R2, it is possible to adjust the node voltage V' to be equal to or lower than (VDD+Vth) or equal to or higher than (GND−Vth); accordingly, it becomes possible to surely electrically disconnect the application terminal for the drive voltage V and the second input terminal of the filter 12 (and the non-inverting input terminal (−) of the comparator 13) from each other by surely turning off the analog switch S1 (V). In the meantime, this also applies to the turned-off analog switch circuit 11W.

Accordingly, the selector 111 the second structural example can surely transmit the drive voltage only to be selected and output for a phase to the comparator 13; therefore, it becomes possible to avert an erroneous operation of the output feedback control performed by the controller 14 (and the drive control of the three-phase motor 20).

Meanwhile, in the above description, the case where the drive voltage U is selected and output from the selector 11 in the second structural example is described as an example; however, it goes without saying that it is also possible to obtain the same effect as the above description in a case where the drive voltages V and W are selected and output.

Besides, as to the structure of the analog switch circuits 11C, 11U, 11V, and 11W, it is possible to employ not only the structure in FIG. 3 but also the structures in FIG. 1 and FIG. 2.

<Application Target of Motor Drive Apparatus>

Figure 9:
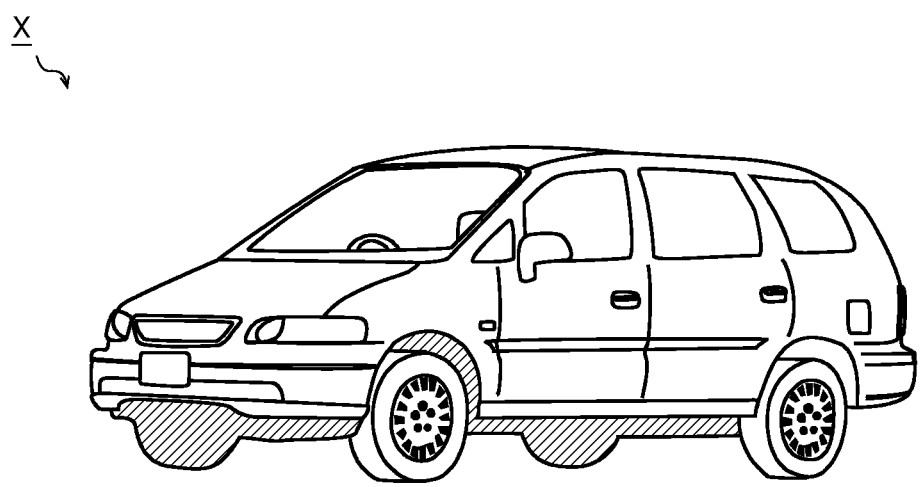
FIG. 9 is an appearance view of a vehicle that incorporates a motor drive apparatus.
Figure 10:
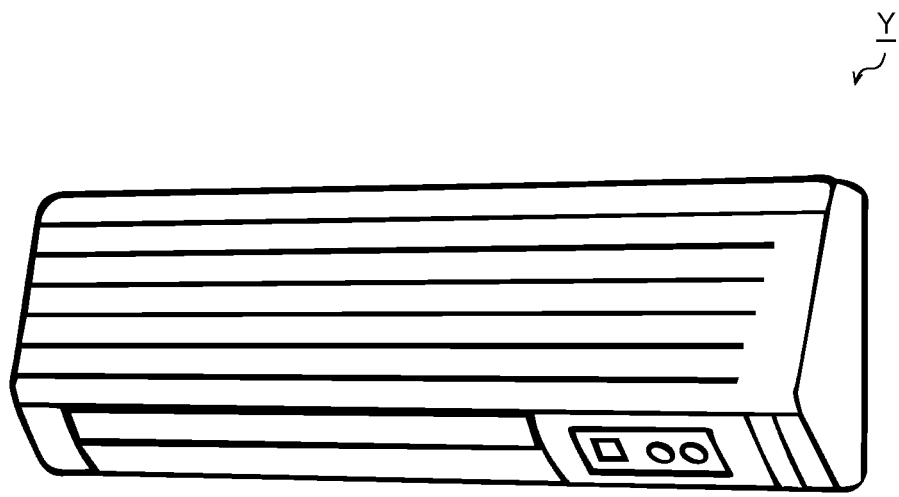
FIG. 10 is an appearance view of a home appliance (air conditioner) that incorporates a motor drive apparatus.

The motor drive apparatus 10 described above is incorporable in electric vehicles X (see FIG. 9) such as an electric car, a hybrid car and the like, home appliances Y such as an air conditioner and the like (see FIG. 10), or industrial apparatuses and the like.

<Other Variations>

In the meantime, the various technological features disclosed in the present specification are able to be modified in various ways without departing from the spirit of the technological creation besides the above embodiment. In other words, it should be considered that the above embodiments are examples in all respects and are not limiting, and it should be understood that the technological scope of the present invention is not indicated by the above description of the embodiments but by the claims, and all modifications within the scope of the claims and the meaning equivalent to the claims are covered.

INDUSTRIAL APPLICABILITY

The present invention is preferably usable as a technology to prevent an erroneous operation during an output feedback control time in a motor drive apparatus that performs drive control of a three-phase motor.

REFERENCE SIGNS LIST 1 analog switch circuit
10 motor drive apparatus
11 selector
11U, 11V, 11W, 11C analog switch circuits
12 filter
13 comparator
14 controller
15 driver
20 three-phase motor (three-phase brushless motor)
S1, S2, S3 analog switches
R1, R2, R3 resistors
X electric vehicle
Y home appliance

The invention claimed is:

1. An analog switch circuit comprising:
a first resistor having a first end and a second end, the first end being connected to an input terminal to which an input voltage is applied;
a first analog switch of CMOS type having a first terminal and a second terminal, the first terminal being connected to the second end of the first resistor and the second terminal being connected to an output terminal, wherein the first analog switch is turned on/off by a control voltage defined between a high control voltage and a low control voltage; and
a second analog switch of CMOS type having a first terminal and a second terminal, the first terminal of the second analog switch being connected to the second end of the first resistor and the second terminal of the second analog switch being connected to a ground terminal,
wherein the second analog switch is turned on when the first analog switch is turned off and the input voltage of the input terminal is lower than the low control voltage or higher than the high control voltage.

2. The analog switch circuit according to claim 1, further comprising
a third analog switch of CMOS type which is inserted between the first resistor and the input terminal, and is turned on/off in a phase identical to the first analog switch.

3. The analog switch circuit according to claim 2, further comprising a second resistor that is inserted between the third analog switch and the input terminal.

4. The analog switch circuit according to claim 1, further comprising a third resistor that is inserted between the second analog switch and the ground terminal.

5. A motor drive apparatus comprising:
a selector that selects and outputs successively each of phase drive voltages for a motor:
a comparator that compares a common voltage of the motor with the selected phase drive voltage to generate a comparison signal;
a controller that generates a phase drive control signal for the motor in accordance with the comparison signal; and
a driver that generates the phase drive voltage for the motor in accordance with the phase drive control signal: wherein
the selector includes the analog switch circuit according to claim 1 for each of phases as a device for electrically connecting/disconnecting an application terminal for the phase drive voltage and the comparator.

6. The motor drive apparatus according to claim 5, wherein the analog switch circuits for the respective phases share the third resistor with each other.

7. The motor drive apparatus according to claim 6, wherein the selector is inserted between application terminal for the common voltage and the comparator and further includes a dummy analog switch circuit that is normally kept in an on-state.

8. The motor drive apparatus according to claim 5, further comprising a filter that is inserted between the selector and the comparator.

9. The motor drive apparatus according to claim 8, wherein the filter is an RC filter that uses a resistor and a capacitor.

10. An electric vehicle comprising the motor drive apparatus according to claim 5.

11. A home appliance comprising the motor drive apparatus according to claim 5.

12. An industrial apparatus comprising the motor drive apparatus according to claim 5.

13. The analog switch circuit according to claim 4 wherein a resistance value of the first resistor is set at a value larger than a resistance value of the third resistor.

14. The analog switch circuit according to claim 1, wherein the second analog switch is turned off when the first analog switch is turned on.

15. The analog switch circuit according to claim 1, wherein the second analog switch is turned on when the first analog switch is turned off and the input voltage of the input terminal is between the low control voltage and the high control voltage.

16. The analog switch circuit according to claim 5, further comprising a third resistor that is inserted between the second analog switch and the ground terminal.

17. The analog switch circuit according to claim 5, wherein the second analog switch is turned off when the first analog switch is turned on.

18. The analog switch circuit according to claim 5, wherein the second analog switch is turned on when the first analog switch is turned off and the input voltage of the input terminal is between the low control voltage and the high control voltage.

19. The motor drive apparatus according to claim 5, wherein the motor is a three-phase motor.

* * * * *